United States Patent
Ow et al.

(10) Patent No.: US 12,048,948 B2
(45) Date of Patent: Jul. 30, 2024

(54) METHODS FOR FORMING MICROWAVE TUNABLE COMPOSITED THIN-FILM DIELECTRIC LAYER

(71) Applicant: APPLIED MATERIALS, INC., Santa Clara, CA (US)

(72) Inventors: Yueh Sheng Ow, Singapore (SG); Yue Cui, Singapore (SG); Arvind Sundarrajan, Singapore (SG); Nuno Yen-Chu Chen, Singapore (SG); Guan Huei See, Singapore (SG); Felix Deng, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 730 days.

(21) Appl. No.: 16/427,723

(22) Filed: May 31, 2019

(65) Prior Publication Data
US 2020/0206775 A1 Jul. 2, 2020

Related U.S. Application Data

(60) Provisional application No. 62/784,977, filed on Dec. 26, 2018.

(51) Int. Cl.
*B05D 3/06* (2006.01)
*H01L 23/00* (2006.01)
(Continued)

(52) U.S. Cl.
CPC ............ *B05D 3/06* (2013.01); *H01L 24/03* (2013.01); *H01L 24/05* (2013.01);
(Continued)

(58) Field of Classification Search
CPC ............ B05D 3/06; H01L 24/03; H01L 24/05
See application file for complete search history.

(56) References Cited

U.S. PATENT DOCUMENTS

| 5,879,756 A | 3/1999 | Fathi et al. |
| 6,444,336 B1 | 9/2002 | Jia et al. |

(Continued)

FOREIGN PATENT DOCUMENTS

| JP | 2006-028271 A | 2/2006 |
| JP | 2009-206457 | 9/2009 |

OTHER PUBLICATIONS

Farnsworth et al., Variable Frequency Microwave Curing of Photosensitive Polyimides, IEE Transactions on Components and Packaging Technologies, vol. 24, No. 3, pp. 474-481, Sep. 2001. (Year: 2001).*

(Continued)

*Primary Examiner* — Michael P Wieczorek
(74) *Attorney, Agent, or Firm* — Moser Taboa

(57) ABSTRACT

Methods of curing a polymer layer on a substrate using variable microwave frequency are provided herein. In some embodiments, methods of curing a polymer layer on a substrate using variable microwave frequency include (a) forming a first thin-film polymer layer on a substrate, the first thin-film polymer layer including at least one first base dielectric material and at least one microwave tunable material, (b) applying a variable frequency microwave energy to the substrate and the first thin-film polymer layer to heat the substrate and the first thin-film polymer layer to a first temperature, and (c) adjusting the variable frequency microwave energy applied to the substrate and the first thin-film polymer layer to tune at least one material property of the first thin-film polymer layer.

11 Claims, 5 Drawing Sheets

(51) Int. Cl.
*H01P 3/08* (2006.01)
*H01P 11/00* (2006.01)

(52) U.S. Cl.
CPC .............. *H01L 2224/03515* (2013.01); *H01L 2224/0401* (2013.01); *H01L 2224/05024* (2013.01); *H01L 2924/19031* (2013.01); *H01L 2924/19032* (2013.01); *H01L 2924/3511* (2013.01); *H01P 3/08* (2013.01); *H01P 11/003* (2013.01)

(56) References Cited

U.S. PATENT DOCUMENTS

| | | | |
|---|---|---|---|
| 6,737,179 | B2 | 5/2004 | Sengupta |
| 6,887,580 | B2* | 5/2005 | Tokuhisa ............. B32B 15/08 428/473.5 |
| 6,960,546 | B2 | 11/2005 | Caspers et al. |
| 7,479,696 | B2 | 1/2009 | Kim et al. |
| 9,786,576 | B2* | 10/2017 | Matsutani ............. H01L 24/13 |
| 2007/0158869 | A1 | 7/2007 | Yanagida et al. |
| 2010/0264356 | A1 | 10/2010 | Cook et al. |
| 2013/0270747 | A1* | 10/2013 | Tranter .............. B29C 35/0266 264/480 |
| 2013/0299953 | A1 | 11/2013 | Hubbard et al. |
| 2014/0068962 | A1 | 3/2014 | Mori et al. |
| 2014/0284821 | A1* | 9/2014 | Hubbard ............. H01L 23/293 257/792 |
| 2014/0319129 | A1 | 10/2014 | Ahmad |
| 2016/0353522 | A1 | 12/2016 | Rathi et al. |
| 2017/0365490 | A1* | 12/2017 | Ow ...................... H01L 23/293 |

OTHER PUBLICATIONS

International Search Report and Written Opinion for PCT/US2019/062934 filed Mar. 19, 2020.
U.S. Appl. No. 15/451,603, filed Mar. 7, 2017, Ow et al.
J. Coburn, M. Pottiger, C. Pryde Structure Development in Polyimide Films,—MRS Proceedings, Cambridge Univ Press (1993).
G.M. Odegard and A. Bandyopadhyay Physical Aging of Epoxy Polymers and Their Composites Journal of Polymer Science Part B: Polymer Physics 49(24) 1695-1716 (2011).

* cited by examiner

METHODS FOR FORMING MICROWAVE TUNABLE COMPOSITED THIN-FILM DIELECTRIC LAYER

CROSS-REFERENCE

This application claims benefit of U.S. provisional patent application Ser. No. 62/784,977, filed Dec. 26, 2018 which is herein incorporated by reference in its entirety.

FIELD

Embodiments of the present disclosure generally relate to curing polymers using microwave energy.

BACKGROUND

Layers of various conductive and non-conductive polymeric materials are applied to semiconductor wafers during various stages of production. For example, organic materials (e.g., such as polyimide, PBO (Poly(p-phenylene benzobisoxazole), Phenolic, Epoxy, etc.) or inorganic materials (e.g., such as Oxide, Oxynitride, nitride, carbide, etc.) are frequently used in semiconductor manufacturing for forming dielectric layers of interconnects (e.g. packaging's Redistribution Layer process (RDLs) or Back-end of line (BEOL)). The back end of line (BEOL) is the second portion of IC fabrication where the individual devices get interconnected with wiring on the substrate.

Typically, the dielectric layers/films formed, have fixed electrical, thermomechanical, and chemical properties. Furthermore, the polymers above typically require longer times and higher temperatures to cure when conventional heating techniques are used. This can lead to throughput issues as well as create defects on the substrates. For example, when polyimide is cured using conventional heating techniques, the outer surface of the polymer typically cures faster than the center portions. This can cause various physical defects, such as the formation of voids, and can result in inferior mechanical properties such as reduced modulus, enhanced swelling, solvent uptake, and coefficient of thermal expansion. Furthermore, the higher temperatures used in conventional curing techniques creates a lot of warpage due to differences in thermal expansion of the materials present during in packaging RDL process.

Accordingly, the inventors have developed improved methods of forming composited thin-film dielectric layer have tunable material properties and that can be cured faster and at lower temperatures.

SUMMARY

Methods of curing a polymer layer on a substrate using variable microwave frequency are provided herein. In some embodiments, methods of curing a polymer layer on a substrate using variable microwave frequency include (a) forming a first thin-film polymer layer on a substrate, the first thin-film polymer layer including at least one first base dielectric material and at least one microwave tunable material, (b) applying a variable frequency microwave energy to the substrate and the first thin-film polymer layer to heat the substrate and the first thin-film polymer layer to a first temperature, and (c) adjusting the variable frequency microwave energy applied to the substrate and the first thin-film polymer layer to tune at least one material property of the first thin-film polymer layer.

In some embodiments, a method of curing a polymer layer on a substrate using variable microwave frequency may include (a) forming a first thin-film polymer layer on a substrate, the first thin-film polymer layer including: at least one first base dielectric material; and at least one microwave tunable material, wherein the at least one microwave tunable material is at least one of (1) a high polar additive material to speed up curing process and reduce curing temperature, (2) a microwave responsive additive at least one of electrical, mechanical, thermal, or chemical that are modified based on exposure to microwaves, or (3) non-polar materials, (b) applying a variable frequency microwave energy to the substrate and the first thin-film polymer layer to heat the substrate and the first thin-film polymer layer to a first temperature; and (c) adjusting the variable frequency microwave energy applied to the substrate and the first thin-film polymer layer to tune at least one material property of the first thin-film polymer layer.

In some embodiments, a method of curing a plurality of polymer layers on a substrate using variable microwave frequency may include forming a plurality of thin-film polymer layers on a substrate, wherein each of the plurality of thin-film polymer layers include at least one base dielectric material and at least one microwave tunable material; and applying a different variable frequency microwave energy to each of the plurality of thin-film polymer layers such that each of the each of the plurality of thin-film polymer layers has been tuned to exhibit different material properties from an adjacent layer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate only typical embodiments of the disclosure and are therefore not to be considered limiting of scope, for the disclosure may admit to other equally effective embodiments.

DETAILED DESCRIPTION

Improved methods of forming composited thin-film dielectric layer have tunable material properties and that can be cured faster and at lower temperatures are disclosed herein. Embodiments of the present disclosure advantageously allow flexible dielectric forming process during manufacturing using Variable Frequency Microwave (VFM) technology to (1) cure polymer dielectric at lower temperature thus reducing difference in thermal expansion that results in lower warpage in packaging RDL process, and (2)

modify dielectric layer for better electrical (e.g., lower parasitic capacitance, higher breakdown voltage) and thermal-mechanical (e.g., higher elongation that exhibits stronger mechanical stress, good thermal conductivity, etc.) properties.

More specifically, by adding one or more materials to the dielectric material used in forming the substrates, and associated layers disposed thereon, that respond in different ways to various frequencies (i.e., excited energy) during microwave curing, the material properties can be tuned. For example, using excited energy during microwave curing (e.g., frequency range: 5.85 GHz-6.65 GHz) can advantageously lower cure temperature/time and advantageously modify material properties in one or more of the following areas: electrical properties (e.g., k-value, dielectric breakdown, loss factor, loss tangent, etc.), thermal-mechanical properties (e.g., elongation (%), modulus, tensile strength, thermal conduction, etc.), and chemical properties (e.g., resistance to various chemistries).

Figure 1:
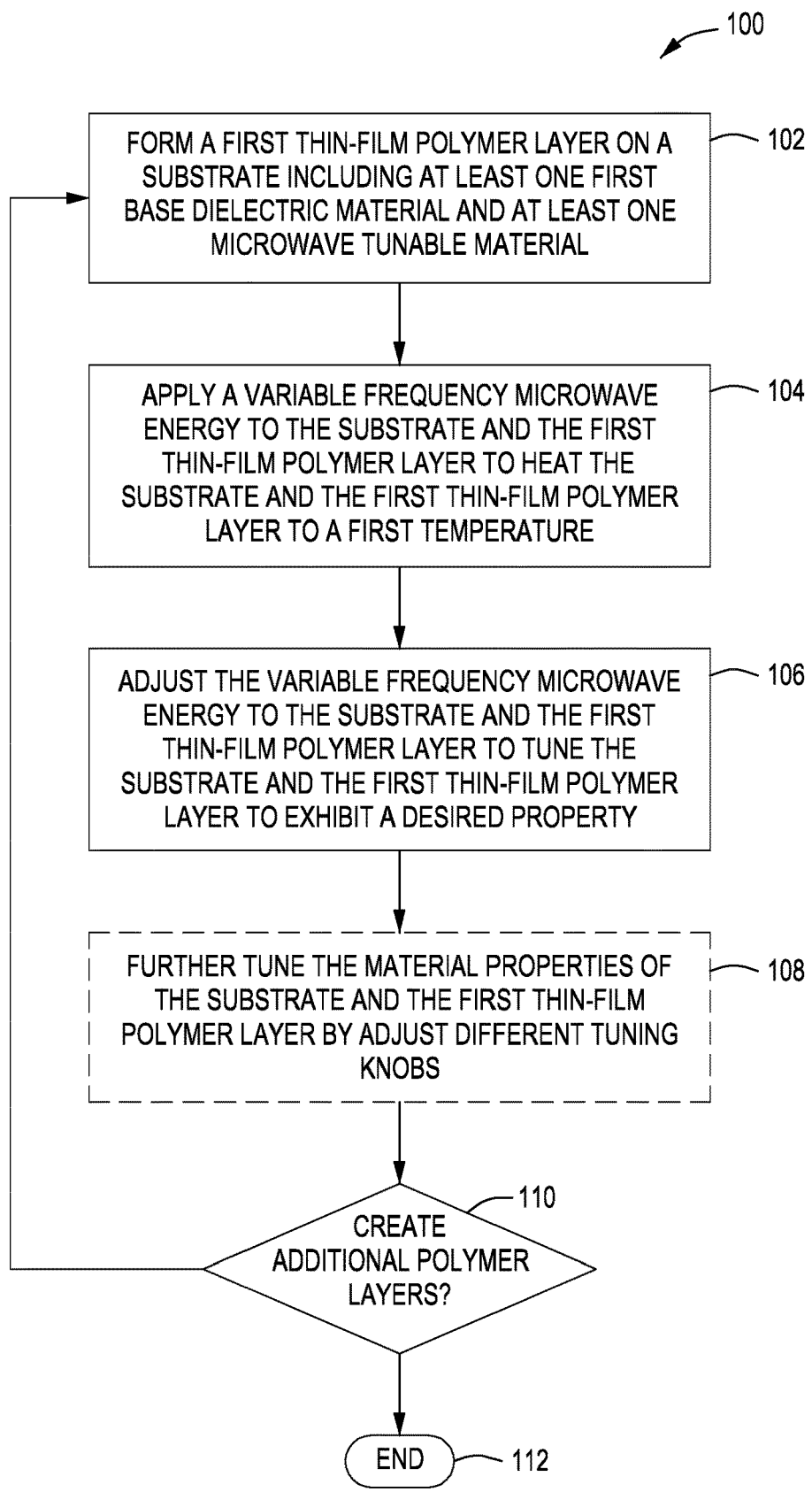
FIG. 1 depicts a flow chart for a method of curing a polymer layer on a semiconductor substrate in accordance with some embodiments of the present disclosure.

FIG. 1 is a flow diagram of a method 100 of curing a polymer layer on a semiconductor substrate having a base dielectric material in accordance with some embodiments of the present disclosure. A semiconductor substrate having a base dielectric material and a polymer layer disposed thereon is placed into a suitable microwave processing chamber such as discussed below with respect to FIG. 2.

The method 100 is performed at vacuum (e.g., about 50 to about 1e-6 Torr, or below). The inventors have observed that performing the method 100 at vacuum helps to drive out volatile precursor (e.g. gases and vapors) residue that forms during the curing process. Conventional non-microwave curing occurs at high pressure (e.g., about 1 atmosphere, or about 760 Torr) and thus uses high temperature to drive out residues.

The method 100 begins at 102, where a first thin-film polymer layer is formed on a substrate including at least one first base dielectric material and at least one microwave tunable material. In some embodiments, the first thin-film polymer layer is about 1.0 micron to about 25 microns thick. In some embodiments, the base dielectric material is organic based. For example, the base organic dielectric material may be formed of Polyimide, PI, PBO, Phenolic, Epoxy, BCB, and the like. In other embodiments, the base dielectric material is inorganic based. In some embodiments, the base inorganic dielectric material may be formed of Oxide, Oxynitride, Nitride, Carbide, etc., and the like. The at least one microwave tunable material included in the first thin-film polymer layer, or otherwise added to the organic or inorganic base dielectric material, may comprise a material that is (a) a high polar additive to speed up curing process and reduce the curing temp, (b) a microwave responsive additive with certain desired properties (electrical, mechanical and thermal, chemical, etc.), and/or (c) non-polar materials with certain desired properties.

In some embodiments, the polar additives added to the organic/inorganic dielectric base material may include water, ethanol, methanol, isopropanol (IPA), acetic acid, acetone, n-propanol, n-butanol, formic acid, propylene, carbonate, ethyl acetate, dimethyl sulfoxide, acetonitrile (MECN), dimethylformamide, tetrahydrofuran, and/or dichloromethane. In some embodiments, the non-polar additives may include Pentane, cyclopentane, hexane, cyclohexane, benzene, toluene, dioxane, chloroform, and/or diethyl ether.

In contrast to the non-polar additives, the polar additives have significantly higher dielectric constants and dipole moments. Like the water molecules, in presence of microwave energy these polar molecules will be set into rotational movement (possible in available space). Anywhere the vapors of these solvents can deposit, even deep into the pores of the porous dielectric film, microwave energy has the capability to agitate these molecules and stir up the reaction. It will be preferred to stay below the boiling point of the solvent or reagent to allow some additional rotational movement within the pores before going to higher process temperature.

At 104, a first variable frequency microwave energy is applied to the substrate (e.g., a semiconductor substrate) to heat the polymer layer and substrate to a first temperature. The polymer layer is heated from about room temperature (e.g., about 25 degrees Celsius) to a first temperature of about 100 to about 200 degrees Celsius (i.e., a soak temperature). The polymer layer is heated to remove any residual solvents in the polymer layer. In some embodiments, the polymer layer is heated from room temperature to the first temperature at a first rate of about 0.01 degrees Celsius to about 4 degrees Celsius per second, such as about 2 degrees Celsius per second. The polymer layer is maintained at the first temperature for a first period of time sufficient to remove any residual solvents. In some embodiments, the first period of time is about 10 minutes to about 60 minutes. Furthermore, the polymer layer is maintained at the first temperature for the first period of time selected to tune, or control, material properties of the polymer layer.

The temperature of the polymer layer and the semiconductor substrate is controlled by the amount of microwave energy applied to the polymer layer and the semiconductor substrate. The greater the amount of microwave energy supplied the greater the temperature of the polymer layer and the semiconductor substrate. In some embodiments, the semiconductor substrate is subjected to microwave energy from a broad C-band source with microwave frequencies ranging from about 5.85 GHz to about 6.65 GHz. In some embodiments, the sweep rate is about 0.25 microseconds per frequency across 4096 frequencies in the C-band. The use of variable frequency and a fast sweeping prevents standing wave formation and charge accumulation and the need for a rotating thermal load. The use of variable frequency also allows for uniform cross substrate temperature distribution. The application of microwave energy also results in the substrate (e.g. a silicon wafer) becoming a direct heater itself.

Next, at 106, the variable frequency microwave energy is adjusted to tune the substrate and the first thin-film polymer layer to exhibit a desired property during curing of the polymer layer. The temperature of the polymer layer and the semiconductor substrate is increased to a second temperature of about 200 to about 400 degrees Celsius. In some embodiments, the polymer layer is heated from the first temperature to the second temperature at a second rate of about 0.01 degrees Celsius per second to about 4 degrees Celsius per second, such as about 2 degrees Celsius per second. The polymer layer is maintained at the second temperature for a second period of time of about 5 minutes to about 60 minutes.

Imidization is the major chemical reaction that occurs during polymer curing. The inventors have observed that, unlike convention non-microwave curing methods, microwave curing methods helps imidization by delivering energy directly to the polarizable dipoles on polyimide molecules, which causes functional group rotation at reaction sites. In addition, microwave curing provides for a low thermal budget that can decrease the stress built in the cured polymer layer. Microwave curing also improves polymer molecule alignment. Microwave power provides additional molecule vibration resulting in the molecule tending to arrange in a lower energy state (i.e., an ordered layer). Improving the polymer molecule alignment changes material properties of the polymer layer. The inventors have discovered that controlling the above-described parameters facilitates control over the amount of polymer molecule alignment thus advantageously facilitating control, or tuning, of material properties of the polymer layer.

In some embodiments, at 108, the material properties of the substrate and the first thin-film polymer layer are further tuned by adjust different tuning knobs. Example knobs/controls that may be adjusted for tuning purposes may include controls that control the following chamber processing parameters: frequency, power, temperature, pressure, waveguide configuration, chamber configuration, assistive hardware to tune the microwave distribution in chamber, and the like.

In some embodiments, the variable microwave frequency, or other chamber processing parameters, may be tuned to selectively heat up certain component(s) of substrate (i.e., a particular layer, or a particular structure formed on the substrate or polymer layers, etc.) or the process chamber itself.

Figure 4:
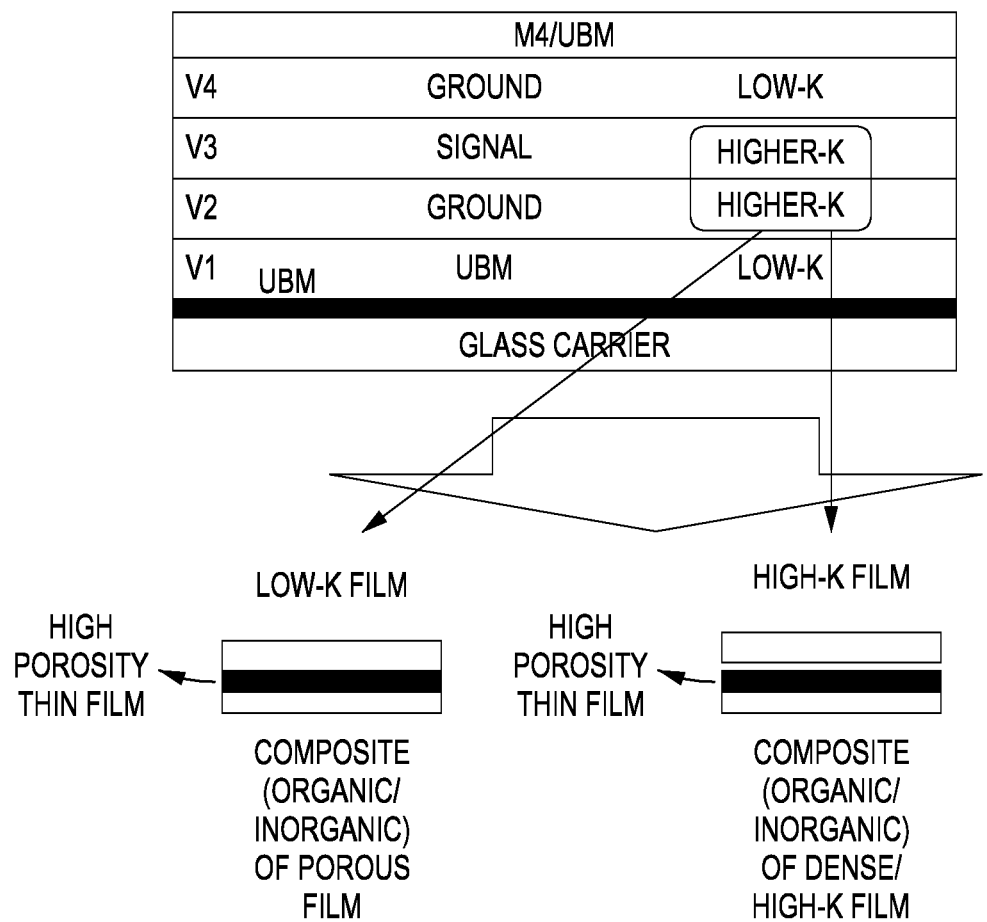
FIG. 4 depicts a substrate having multiple thin-filmed layers formed thereon each have different material properties in accordance with some embodiments of the present disclosure.

At 110, if additional polymer layers are to be formed, the method returns to 102 and repeats again until all layers are formed and tuned to the desired properties to form a structure as shown, for example, in FIG. 4. At 110, if no additional polymer layers are to be formed, the method ends at 112.

The method 100 advantageously creates a thin-filmed substrate structures that have electrical material properties that can be tuned (dielectric constant, Loss factor, Loss tangent, Breakdown voltage, etc.), mechanical material properties that can be tuned (e.g., Elongation, Modulus, Tensile strength, etc.), thermal material properties that can be tuned (CTE, Thermal conductivity, 5% weight loss, Thermal stability, etc.), and chemical material properties that can be tuned (resistance to various chemistries).

In some embodiments, the methods described above can be used to form a plurality of thin-film polymer layers on a substrate using variable microwave frequency wherein each of the plurality of thin-film polymer layers include at least one base dielectric material and at least one microwave tunable material, and wherein a different variable frequency microwave energy is applied to each of the plurality of thin-film polymer layers such that each of the each of the plurality of thin-film polymer layers has been tuned to exhibit different material properties from an adjacent layer as shown in FIG. 4.

Figure 2:
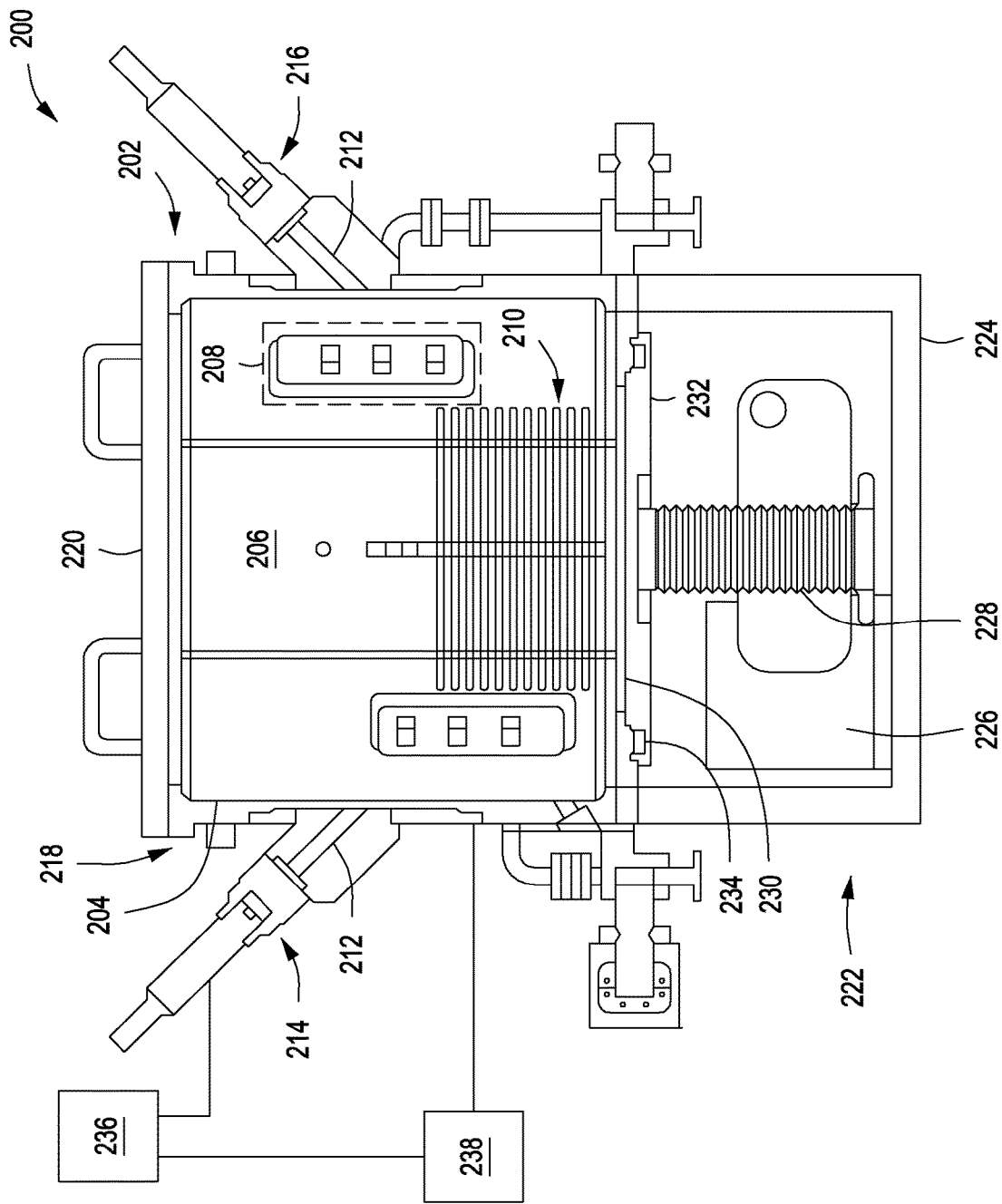
FIG. 2 depicts a schematic side view of a process chamber for a polymer microwave curing process in accordance with some embodiments of the present disclosure.

FIG. 2 depicts a suitable microwave processing chamber 200 for performing the method 100 described above. The microwave processing chamber 200 comprises an octagonal body 202. The octagonal body 202 has a thickness sufficient for use as a microwave chamber. The octagonal body 202 comprises an octagonal cavity 204 having a first volume 206. One or more substrates 210, for example semiconductor wafers or other substrates having materials to be microwave cured may be disposed within the octagonal cavity 204 during curing operations. A top 218 of the octagonal body 202 has a lid 220 to seal the first volume 206.

The octagonal body 202 is suitable for receiving variable frequency microwave energy. The octagonal body 202 further comprises a plurality of openings 208 fluidly coupled to the first volume 206. The plurality of openings 208 facilitates delivery of the microwave energy to the first volume 206. The plurality of openings 208 are coupled to a suitable variable frequency microwave source 238. In some embodiments, each opening 208 may be rectangular. In some embodiments, each opening 208 may include angled sidewalls that enlarge the opening on a side of the opening facing the first volume 206. In some embodiments, the openings 208 are staggered, or spaced apart, along the octagonal body 202. In some embodiments, the octagonal body 202 comprises four openings 208, wherein two of the four openings 208 are disposed along the octagonal body 202 opposite to each other and the other two openings 208 are disposed along the octagonal body 202 opposite to each other but not opposite to the first two openings 208. In some embodiments, each opening 208 is a singular opening along the octagonal body 202. In some embodiment, each opening 208 comprises multiple openings along the octagonal body 202.

The octagonal body 202 comprises one or more ports 212 fluidly coupled to the first volume 206. One or more temperature sensors 214, 216 are disposed within the ports 212 to measure a temperature of the one or more semiconductor substrates within the first volume 206. The temperature sensors 214, 216 are coupled to a PID controller 236, which is coupled to the variable frequency microwave source 238 to control the amount of microwave power supplied to the microwave processing chamber 200. An exhaust port (not shown) may be coupled to the octagonal body 202 and fluidly coupled to the first volume 206 to create a vacuum within the first volume 206 suitable for performing method 100.

The microwave processing chamber 200 further comprises a substrate transfer apparatus 222 having a lower chamber 224. The lower chamber 224 is disposed below the octagonal body 202 and is coupled to the octagonal body 202. The lower chamber 224 comprises a second volume 226 holding one or more substrates 210 (such as semiconductor substrates). The second volume 226 is fluidly coupled to the first volume 206. In some embodiments, the one or more substrates 210 are aligned parallel to each other in a stacked configuration.

A lift mechanism 228 is provided to lift the one or more substrates 210 from the lower chamber 224 into the first volume 206 of the octagonal cavity 204. The lift mechanism 228 may be any suitable lift mechanism, such as an actuator, motor, or the like. In some embodiments, the lift mechanism 228 is coupled to a substrate support 230 that may be disposed in the lower chamber 224 or moved into the first volume 206 of the octagonal cavity 204.

Once the one or more substrates 210 are raised into the first volume 206 of the octagonal cavity 204, a lower plate 232 coupled to the substrate support 230 seals a second volume 226 of the lower chamber 224 from the first volume 206 of the octagonal cavity 204 to prevent escape of microwaves and maintain a predetermined pressure in the first volume 206. The lower plate 232 butts up against, or mates with, an adapter 234 such that there is no gap, or a minimal gap, between the lower plate 232 and the adapter 234, thus sealing the first volume 206. The adapter 234 is coupled to an inner surface of the lower chamber 224.

Figure 3A:
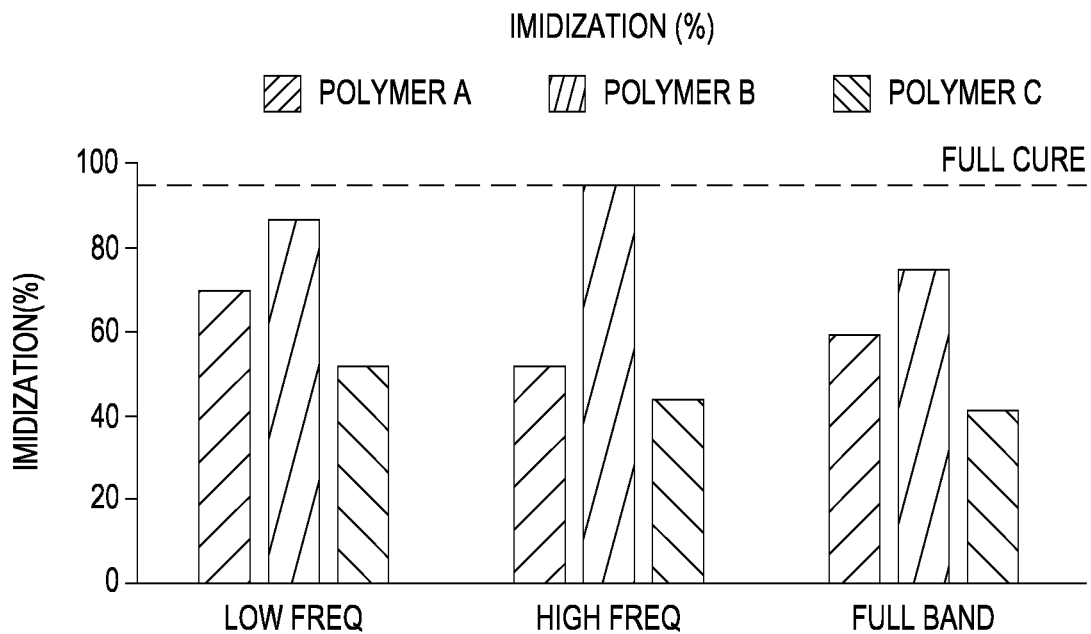
FIGS. 3A-3D depicts a comparison of material properties of three different polymers in accordance with some embodiments of the present disclosure.
Figure 3B:
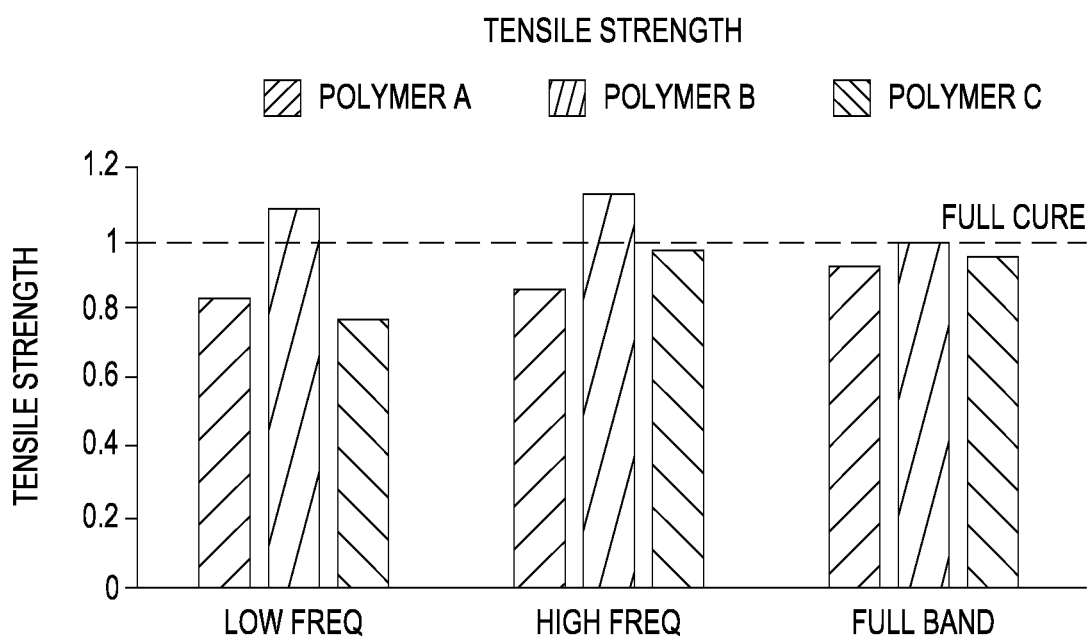
Figure 3C:
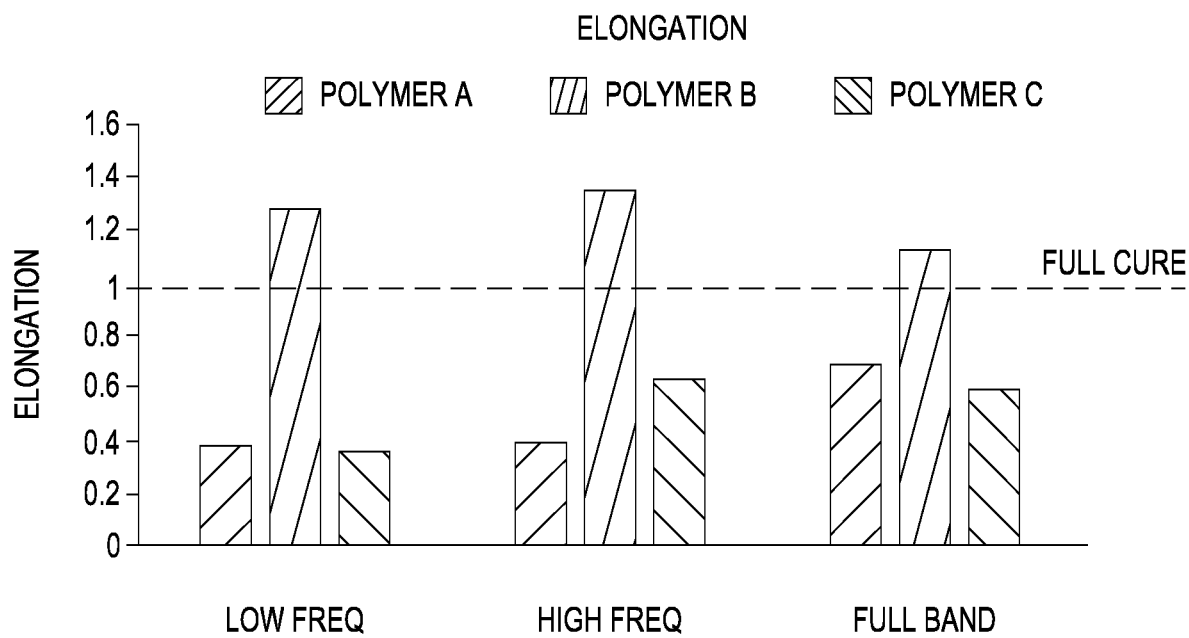
Figure 3D:
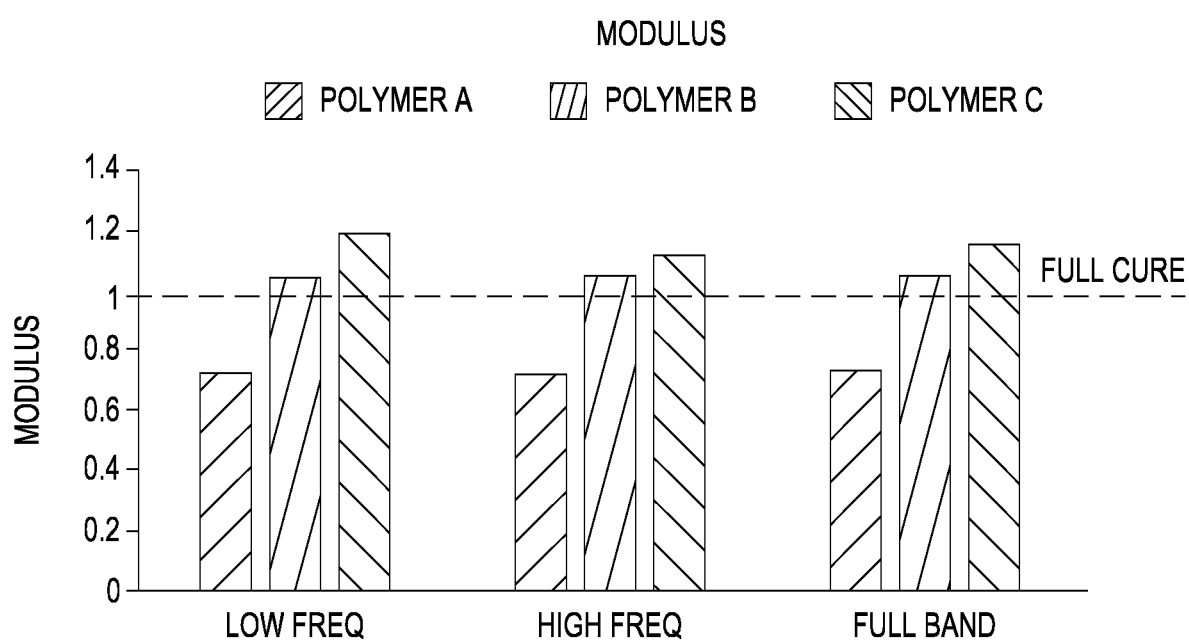

FIGS. 3A-3B depicts a comparison of material properties of three different polymers (A, B, and C) and the effect that various levels or microwave curing using low frequency, high frequency, and full band curing has on the different polymers. The different polymers (A, B, and C) used may include high porosity inorganic (e.g., Carbon-, fluorine-, or CH3-doped SiO2) or low-k organic polymers. In some embodiments, the different polymers (A, B, and C) used may include denser inorganic film (e.g., SiO2 or Si3N4) or higher-k organic film.

In FIGS. 3A-3D, the range of "Full Band" corresponds to the full range of frequencies as described above to be about 5.85 GHz to about 6.65 GHz. The ranges of "Low Freq" and "High Freq" correspond to the lower and upper regions of this range. For example, in some embodiments, Low Freq may be about 5.85-6.05 GHz and High Freq may be about 6.45 GHz-6.65 Ghz. In some embodiments, the sweep rate is about 0.25 microseconds per frequency across 4096 frequencies in the C-band. The use of variable frequency and a fast sweeping prevents standing wave formation and charge accumulation and the need for a rotating thermal load. The use of variable frequency also allows for uniform cross substrate temperature distribution. The application of microwave energy also results in the substrate (e.g. a silicon wafer) becoming a direct heater itself.

In FIGS. 3A-3B, the cure amount of a polymer is calculated by measuring its properties using different metrologies. Those measured values are compared against a furnace "baseline". If the cured polymer matches or exceeds the values of the furnace baseline, it is considered as "Full Cured". The exact furnace baseline conditions are defined by the industry and the vendors, and vary from polymer to polymer. Some exemplary metrologies used to measure the values include Fourier-transform infrared spectroscopy (FTIR) or a thermomechanical analyzer (TMA). FTIR is a technique used to obtain an infrared spectrum of absorption or emission of a solid, liquid or gas. An FTIR spectrometer simultaneously collects high-spectral-resolution data over a wide spectral range. In some embodiments, FTIR is used to measure Imidization Ratio. In some embodiments, TMA is used to measure CTE.

FIG. 4 depicts a substrate having multiple thin-filmed layers formed thereon each have different material properties since they included different polymer additives and were tuned differently. More specifically, FIG. 4 depicts an example of how different dielectric constant films can be deployed in a multiple layers of redistribution interconnects for a microstrip (Signal-Ground) or strip-line (Ground-Signal-Ground) configuration. Higher-k (k>3.9, referenced to SiO2) dielectric film is desired to be deployed between the ground- and signal-plane, so as to increase signal coupling to ground, whereas lower-k (k<3.9) thin film dielectric is generally desired to form the rest of the dielectric layers to reduce noise coming from cross-talk. One example how lower-k thin film can be realized is by inserting a high porosity inorganic (e.g., Carbon-, fluorine-, or CH3-doped SiO2) or low-k organic polymers layer between the thin film dielectric to reduce the effective k-value. This film-stack can be replaced with single- or multiple-layer film of microwave tunable material that tuned to achieve overall lower dielectric constant. Conversely is true for higher-k thin film dielectric, where a sandwiched higher-k thin film can be realized using similar concept by inserting a denser inorganic film (e.g., SiO2 or Si3N4) or higher-k organic film to achieve higher effective k-value. In some embodiments, this film stack is can be replaced with single- or multiple-layer film of microwave tunable material that tuned to achieve overall higher dielectric constant.

In some embodiments, as shown in FIG. 4, the stack may include a low-k under-bump metallization (UBM) layer. The UBM is a patterned, thin-film stack of material that provides 1) an electrical connection from the silicon die to a solder bump; 2) a barrier function to limit unwanted diffusion from the bump to the silicon die; and 3) a mechanical interconnection of the solder bump to the die through adhesion to the die passivation and attachment to a solder bump pad.

While the foregoing is directed to embodiments of the present disclosure, other and further embodiments of the disclosure may be devised without departing from the basic scope thereof.

The invention claimed is:

1. A method of of curing a polymer layer on a substrate using variable microwave frequency, comprising:
    (a) forming a first thin-film polymer layer on a substrate, the first thin-film polymer layer including at least one first base dielectric material and at least one microwave tunable material;
    (b) applying a variable frequency microwave energy to the substrate and the first thin-film polymer layer to heat the substrate and the first thin-film polymer layer to a first temperature; and
    (c) adjusting the variable frequency microwave energy applied to the substrate and the first thin-film polymer layer to tune at least two material properties of the first thin-film polymer layer, wherein the at least two material properties tuned include at least one electrical property and at least one thermal-mechanical property, wherein the at least one electrical property is at least one of a k-value, dielectric breakdown, loss factor, or loss tangent, and wherein the at least one thermal-mechanical properties is one of elongation (%), modulus, tensile strength, or thermal conduction,
    wherein a second thin-film polymer layer is formed over the first thin-film polymer layer, and wherein the second thin-film polymer layer including at least one first base dielectric material and at least one microwave tunable material, the method further comprising:
    applying a variable frequency microwave energy to the second thin-film polymer layer to heat the second thin-film polymer layer to a second temperature; and
    adjusting the variable frequency microwave energy applied to the second thin-film polymer layer to tune at least two material properties of the second thin-film polymer layer, wherein the at least two material properties tuned include at least one electrical property and at least one thermal-mechanical property, wherein the at least one electrical property is at least one of a k-value, dielectric breakdown, loss factor, or loss tangent, and wherein the at least one thermal-mechanical properties is one of elongation (%), modulus, tensile strength, or thermal conduction.

2. The method of claim 1, wherein at least one additional material property of the first thin-film polymer layer is further tuned by adjusting different tuning knobs.

3. The method of claim 1, wherein at least one of frequency, power, temperature, pressure, waveguide configuration, chamber configuration, or in-chamber microwave distribution is adjusted by different tuning knobs.

4. The method of claim 1, wherein at least one additional material property of the second thin-film polymer layer is further tuned by adjusting different tuning knobs.

5. The method of claim 4, wherein the tuning knobs are configured to adjust at least one of frequency, power, temperature, pressure, waveguide configuration, chamber configuration, or in-chamber microwave distribution.

6. The method of claim 1, wherein the variable frequency microwave energy is provided at microwave frequencies ranging from about 5.85 GHz to about 6.65 GHz.

7. The method of claim 1, wherein the first temperature is about 100 degrees to about 200 degrees Celsius.

8. The method of claim 7, wherein the first thin-film polymer layer is maintained at the first temperature for a first period of time of about 10 minutes to about 60 minutes.

9. The method of claim 1, wherein the variable frequency microwave energy is provided at a sweep rate of about 0.25 microseconds per frequency.

10. The method of claim 1, wherein (a)-(c) are performed within a microwave processing chamber under vacuum.

11. A method of curing a polymer layer on a substrate using variable microwave frequency, comprising:
(a) forming a first thin-film polymer layer on a substrate, the first thin-film polymer layer including at least one first base dielectric material and at least one first microwave tunable material;
(b) applying a variable frequency microwave energy to the substrate and the first thin-film polymer layer to heat the substrate and the first thin-film polymer layer to a first temperature; and
(c) adjusting the variable frequency microwave energy applied to the substrate and the first thin-film polymer layer to tune at least one electrical property of the first thin-film polymer layer, wherein the at least one electrical property tuned includes at one of a k-value, dielectric breakdown, loss factor, or loss tangent;
(d) forming a second thin-film polymer layer on the substrate, the second thin-film polymer layer including at least one second microwave tunable material different from the first microwave tunable material;
(e) applying a second variable frequency microwave energy to the substrate and the second thin-film polymer layer to heat the substrate and the second thin-film polymer layer to a second temperature; and
(f) adjusting the second variable frequency microwave energy applied to the substrate and the second thin-film polymer layer to tune at least one thermal-mechanical property of the first thin-film polymer layer, wherein the at least one thermal-mechanical property tuned includes at least one of elongation (%), modulus, tensile strength, or thermal conduction.

* * * * *